(12) United States Patent
Koyata et al.

(10) Patent No.: US 7,288,207 B2
(45) Date of Patent: Oct. 30, 2007

(54) ETCHING LIQUID FOR CONTROLLING SILICON WAFER SURFACE SHAPE AND METHOD FOR MANUFACTURING SILICON WAFER USING THE SAME

(75) Inventors: Sakae Koyata, Tokyo (JP); Yuichi Kakizono, Tokyo (JP); Tomohiro Hashii, Tokyo (JP); Katsuhiko Murayama, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 11/345,009

(22) Filed: Jan. 31, 2006

(65) Prior Publication Data

US 2006/0169667 A1    Aug. 3, 2006

(30) Foreign Application Priority Data

Jan. 31, 2005    (JP) .............................. 2005-022764

(51) Int. Cl.
    C23F 1/00    (2006.01)
(52) U.S. Cl. ............................ 216/88; 216/89; 216/90; 438/693; 438/747; 438/750
(58) Field of Classification Search ................ 216/88, 216/89, 90; 438/692, 693, 747, 750
    See application file for complete search history.

(56) References Cited

U.S. PATENT DOCUMENTS

| 5,429,711 | A  | * | 7/1995 | Watanabe et al. | ........... 438/464 |
| 6,189,546 | B1 | * | 2/2001 | Zhang et al. | ................ 134/1.3 |
| 2005/0112893 | A1 | * | 5/2005 | Koyata et al. | ............. 438/692 |
| 2005/0148181 | A1 | * | 7/2005 | Koyata et al. | ............. 438/689 |

* cited by examiner

*Primary Examiner*—George A. Goudreau
(74) *Attorney, Agent, or Firm*—Reed Smith LLP

(57) ABSTRACT

A method for manufacturing a silicon wafer includes a planarizing process 13 for polishing or lapping the upperside and lowerside surfaces of a thin disk-shaped silicon wafer obtained by slicing a silicon single crystal ingot, an etching process for dipping the silicon wafer into the etching liquid wherein silica powder is dispersed uniformly in an alkali aqueous solution, thereby etching the upperside and lowerside surfaces of the silicon wafer, and a both-side simultaneous polishing process 16 for polishing the upperside and lowerside surfaces of the etched silicon wafer simultaneously or a one-side polishing process for polishing the upperside and lowerside surfaces of the etched silicon wafer one after another, in this order.

8 Claims, 6 Drawing Sheets

ETCHING LIQUID FOR CONTROLLING SILICON WAFER SURFACE SHAPE AND METHOD FOR MANUFACTURING SILICON WAFER USING THE SAME

CROSS-REFERENCES TO RELATED APPLICATION

This application claims priority of Japanese Application No. 2005-0022764 filed Jan. 31, 2005, the entire disclosure of which is hereby incorporated by reference.

BACKGROUND OF THE INVENTION

1. Field of the Invention

The present invention relates to an etching liquid for controlling a silicon wafer surface shape and a method for manufacturing a silicon wafer using the same for reducing loads of a both-side simultaneous polishing process, and attaining both a high flatness degree and the reduction of surface roughness.

2. Description of the Related Art

Generally, the manufacturing processes of a semiconductor silicon wafer include processes of chamfering, mechanical polishing (lapping), etching, mirror grinding (polishing) and cleaning on a wafer that is cut and sliced from a silicon single crystal ingot pulled up, and the wafer is manufactured into a wafer having a highly precise flatness degree. A silicon wafer that goes through mechanical manufacturing processes including block cutting, outer diameter grinding, slicing, lapping and the like has a damaged layer, i.e., a work-affected layer on the surface thereof. The work-affected layer induces crystal defects such as a slip dislocation and the like in the device manufacturing processes, and decreases the mechanical strength of the wafer, and causes adverse effects on the electrical characteristics thereof, and accordingly such defects must be removed completely.

An etching process is performed so as to remove this work-affected layer. In the etching process, either an acid etching method or an alkali etching method is employed. In this etching process, a plurality of wafers are dipped into an etching bath containing an etching liquid, thereby the work-affected layer is chemically removed.

The acid etching has advantages that there is no selective etching property to a silicon wafer, and the surface roughness is small, therefore, the micro shape precision is improved, and the etching efficiency is high. As the etching liquid of this acid etching, an etching liquid of three components obtained by thinning mixed acid of hydrofluoric acid (HF) and nitric acid ($HNO_3$) by water ($H_2O$) or acetic acid ($CH_3COOH$) is mainly employed. It is considered that the acid etching has the above advantages because etching progresses on the basis of diffusion controlling conditions by the above etching liquid, and under the diffusion controlling conditions, the reaction speed does not depend upon the crystal orientation of the crystal surface, crystal defects and the like, and the diffusion on the crystal surface has a main effect. However, in this acid etching, although the work-affected layer can be etched while improving the surface roughness of a silicon wafer, as the acid etching progresses, the outer circumferential portion of the wafer becomes dull, and the flatness degree as micro shape precision obtained by lapping is deteriorated, which causes mm-order concaves and convexes called swells or peels on the etched surface. Further, the cost of the chemical liquid is high, and it is difficult to control and maintain the composition of the etching liquid, which has been a problem in the prior art.

The alkali etching has advantages that the flatness degree is excellent and the macro shape precision is improved, and there is little metal contamination, and there is no problem of harmful secondary products like NOx in the acid etching or no danger in handling thereof. As the etching liquid of this alkali etching, KOH and NaOH are employed. It is considered that the alkali etching has the above advantages because this etching progresses basically on the basis of diffusion controlling conditions. However, in the alkali etching, although the work-affected layer can be etched while maintaining the flatness degree of a silicon wafer, there occur facets whose partial depth is several μm, and whose size is several to several ten μm (hereinafter, referred to as facets) that deteriorates the wafer surface roughness, which has been another problem in the prior art.

As a method to solve the problems in the alkali etching, there is disclosed an etching method of a silicon wafer wherein an etching liquid obtained by adding 0.01 to 0.2 weight percentage of hydrogen peroxide to 100 weight percentage of a caustic soda (sodium hydroxide) aqueous solution is employed (for example, see Patent Document 1) According to the etching method disclosed in the above Patent Document, by adding hydrogen peroxide to a caustic soda aqueous solution at a specified percentage, nonconformities arising in the alkali etching by the caustic soda aqueous solution are solved. Specifically, in comparison with the etching using a NaOH aqueous solution, the size of an etched pit on the lowerside surface of a silicon wafer is made finer. Furthermore, the occurrence of micro etched pits on the lowerside surface of the silicon wafer is restricted, and the desired etching speed can be adjusted easily and in a wide area, and furthermore, the etching speed is increased.

Patent Document 1: Japanese Unexamined Patent Application Publication No. H07-37871 (claims 1 to 4, paragraph [0021])

However, in the conventional methods including the method disclosed in the above Patent Document, a wafer after the etching process is sent to a both-side simultaneous polishing process and a one-side polishing process wherein the surface thereof is processed into a mirror surface. However, in the upperside and lowerside surfaces of the silicon wafer after the etching process, the wafer flatness degree obtained at completion of the planarizing process is not maintained. Furthermore, a desired wafer surface roughness is not obtained yet, and accordingly, in order to improve the wafer flatness degree and the wafer surface roughness, it is necessary to move or remove large amounts of grinding residue in the both-side simultaneous polishing process and the one-side polishing process. As a result, this creates additional time and energy loads on the both-side simultaneous polishing process and the one-side polishing process.

BRIEF SUMMARY OF THE INVENTION

Accordingly, the object of the present invention is to provide an etching liquid for controlling a silicon wafer surface shape and a method for manufacturing a silicon wafer using the same for reducing the time and energy loads on the both-side simultaneous polishing process and the one-side polishing process, and attaining both a high flatness degree at completion of the planarizing process and the reduction of surface roughness.

An invention according to claim 1 is an etching liquid for controlling a silicon wafer surface shape, wherein silica powder is dispersed uniformly in an alkali aqueous solution.

In the invention according to claim 1, the etching liquid for controlling a silicon wafer surface shape, wherein silica powder is dispersed uniformly in an alkali aqueous solution can control the surface roughness and the texture size of a wafer before polishing, and accordingly, by etching a silicon wafer having a work-affected layer after the planarizing process by use of this etching liquid, it is possible to reduce the polishing removal amount in the upperside and lowerside surfaces of the wafer in the both-side simultaneous polishing process and the one-side polishing process, and further attain both the maintenance of a high flatness degree of the wafer and the reduction of the wafer surface roughness at completion of the planarizing process.

An invention according to claim 2 is one according to claim 1, and is an etching liquid wherein the alkali aqueous solution is a 40 to 50 weight % sodium hydroxide aqueous solution, and the addition rate of the silica powder to be added to the alkali aqueous solution is 1 to 100 g/L to the sodium hydroxide.

In the invention according to claim 2, by adding silica powder into the alkali aqueous solution within the above mentioned concentration range in a given proportion, it is possible to more easily maintain the high flatness degree of the wafer and to attain the more reduced wafer surface roughness at complettion of the etching process.

An invention according to claim 3 is one according to claim 1 or 2, and is an etching liquid wherein the average particle diameter of the silica powder is 50 to 5000 nm.

An invention according to claim 4 is a method for manufacturing a silicon wafer as shown in FIG. 1 including a planarizing process 13 for polishing or lapping the upperside and lowerside surfaces of a thin disk-shaped silicon wafer obtained by slicing a silicon single crystal ingot, an etching process 14 for dipping the silicon wafer into the etching liquid according to any one of claims 1 to 3, thereby etching the upperside and lowerside surfaces of the silicon wafer, and a both-side simultaneous polishing process 16 for polishing the upperside and lowerside surfaces of the etched silicon wafer simultaneously, in this order.

In the invention according to claim 4, by the etching process 14 by use of an etching liquid adjusted by adding silica powder to an alkali aqueous solution, the surface roughness and the texture size of a wafer before polishing can be controlled, and accordingly, in the both-side simultaneous polishing process 16, it is possible to reduce the polishing removal amount in the upperside and lowerside surfaces of the wafer, and further attain both the maintenance of a high flatness degree of the wafer at completion of the planarizing process and the reduction of the wafer surface roughness.

An invention according to claim 5 is a method for manufacturing a silicon wafer including a planarizing process for polishing or lapping the upperside and lowerside surfaces of a thin disk-shaped silicon wafer obtained by slicing a silicon single crystal ingot, an etching process for dipping the silicon wafer into the etching liquid according to any one of claims 1 to 3, thereby etching the upperside and lowerside surfaces of the silicon wafer, and a one-side polishing process for polishing the upperside and lowerside surfaces of the etched silicon wafer one after another, in this order.

In the invention according to claim 5, by the etching process by use of an etching liquid adjusted by adding silica powder to an alkali aqueous solution, the surface roughness and the texture size of a wafer before polishing can be controlled, and accordingly, in the one-side polishing process, it is possible to reduce the polishing removal amount in the upperside and lowerside surfaces of the wafer, and further attain both the maintenance of a high flatness degree of the wafer at completion of the planarizing process and the reduction of the wafer surface roughness.

The etching liquid for controlling a silicon wafer surface shape of the present invention is an etching liquid wherein silica powder is dispersed uniformly in an alkali aqueous solution, and this etching liquid can control the surface roughness and the texture size of a wafer before polishing, and accordingly, by etching a silicon wafer having a work-affected layer after the planarizing process by use of this etching liquid, it is possible to reduce the polishing removal amount in the upperside and lowerside surfaces of the wafer in the both-side simultaneous polishing process and the one-side polishing process, and further attain both the maintenance of a high flatness degree of the wafer at completion of the planarizing process and the reduction of the wafer surface roughness.

Further, in the method for manufacturing a silicon wafer, by the etching process by use of an etching liquid adjusted by adding silica powder to an alkali aqueous solution, the surface roughness and the texture size of a wafer before polishing can be controlled, and accordingly, it is possible to reduce the polishing removal amount in the upperside and lowerside surfaces of the wafer in the both-side simultaneous polishing process and the one-side polishing process, and further attain both the maintenance of a high flatness degree of the wafer at completion of the planarizing process and the reduction of the wafer surface roughness.

DESCRIPTION OF THE PREFERRED EMBODIMENTS

Preferred embodiments according to the present invention are illustrated in more details with reference to the attached drawings hereinafter.

The etching liquid for controlling a silicon wafer surface shape of the present invention is an etching liquid wherein silica powder is dispersed uniformly in an alkali aqueous solution. This etching liquid wherein silica powder is dispersed uniformly in an alkali aqueous solution affects metal impurities and the like in a chemical liquid by adding silica powder and restricts selectivity peculiar to alkali etching, thereby can control the surface roughness and the texture size of a wafer before polishing, and accordingly, by etching a silicon wafer having a work-affected layer after the planarizing process by use of this etching liquid, it is possible to reduce the polishing removal amount in the upperside and lowerside surfaces of the wafer in the both-side simultaneous polishing process and the one-side polishing process, and further attain both the maintenance of a high flatness degree of the wafer at completion of the planarizing process and the reduction of the wafer surface roughness.

The etching liquid of the present invention is obtained by adding silica powder to an alkali aqueous solution adjusted to a specified concentration at a specified rate, stirring this added liquid, and dispersing the silica powder uniformly in the alkali aqueous solution. As the alkali aqueous solution to be included in the etching liquid of the present invention, there are potassium hydroxide and sodium hydroxide, and especially among them, a 40 to 50 weight % sodium hydroxide aqueous solution that reduces the surface roughness and restricts the texture size is preferable. Further, it is preferable that the addition rate of the silica powder to be added to this 40 to 50 weight % sodium hydroxide aqueous solution is in the rage of 1 to 100 g/L to the sodium hydroxide, because after the etching process, the high wafer flatness degree can be maintained more easily and the wafer surface roughness can be more reduced. Especially, it is preferable to make the addition rate to the range of 5 to 10 g/L to sodium hydroxide. As the silica powder to be used in the etching liquid of the present invention, silica powder whose average particle diameter is in the range of 50 to 5000 nm is preferable. If the average particle diameter is below 50 nm, there occurs a nonconformity in the affection to the metal impurities in the alkali aqueous solution, and if the average particle diameter is over 5000 mm (5 μm), there occurs a nonconformity that silica powder dispersed in the alkali aqueous solution becomes massed together. The especially preferable average particle diameter of the silica powder is 500 nm (0.5 μm) to 3000 nm (3 μm).

Next, the method for manufacturing a silicon wafer by use of the etching liquid for controlling a silicon wafer surface shape of the present invention is explained hereinafter.

Figure 1:
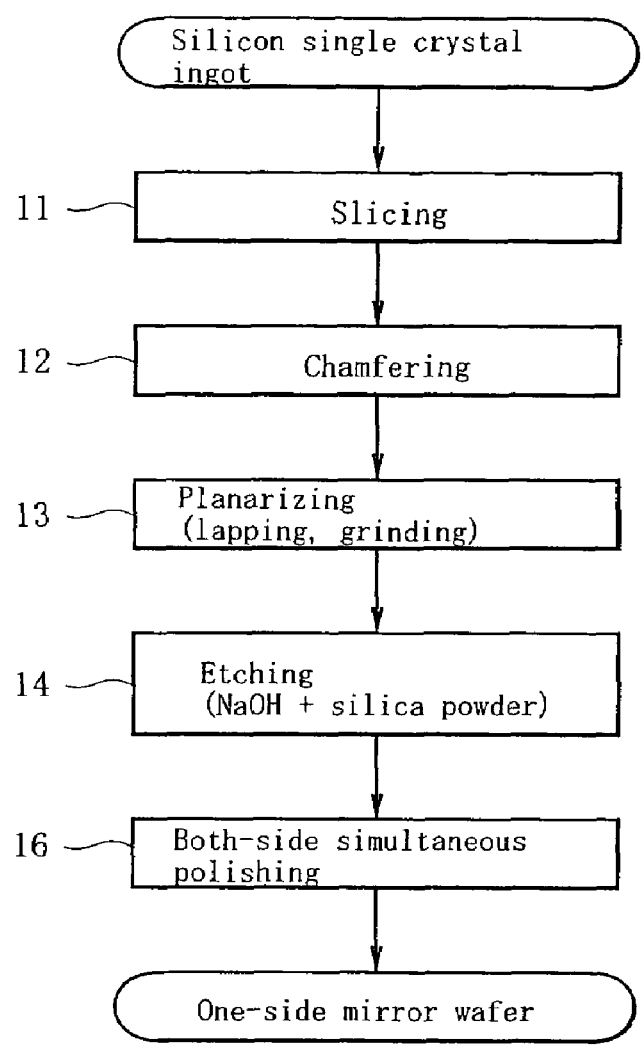
FIG. 1 is a process chart showing a method for manufacturing a silicon wafer according to the present invention.

First, the fore-end portion and the aft-end portion of a grown silicon single crystal ingot are cut and the ingot is made into a block shape, and the outer diameter of the ingot is grinded so as to make the diameter of the ingot uniform and the ingot is made into a block body. In order to show a specific crystal orientation, orientation flats and orientation notches are made on this block body. After this process, as shown in FIG. 1, the block body is sliced with a specified angle to the bar axis direction (step 11). The circumference of a wafer sliced at the step 11 is chamfered so as to prevent cracks and chips in the circumferential portion of the wafer (step 12). By performing this chamfering process, it is possible to restrict for example a crown phenomenon wherein an erroneous growth occurs on the circumferential portion at epitaxial growth on a silicon wafer that is not chamfered and embossment occurs in a ring shape.

Next, the concave and convex layers on the upperside and lowerside surfaces of the thin disk-shaped silicon wafer that have occurred in the slicing process and the like are planarized flat and the flatness degree of the upperside and lowerside surfaces of the wafer and the parallel degree of the wafer are increased (step 13). In this planarizing process 13, the upperside and lowerside surfaces of the wafer are planarized by grinding or lapping.

Figure 2:
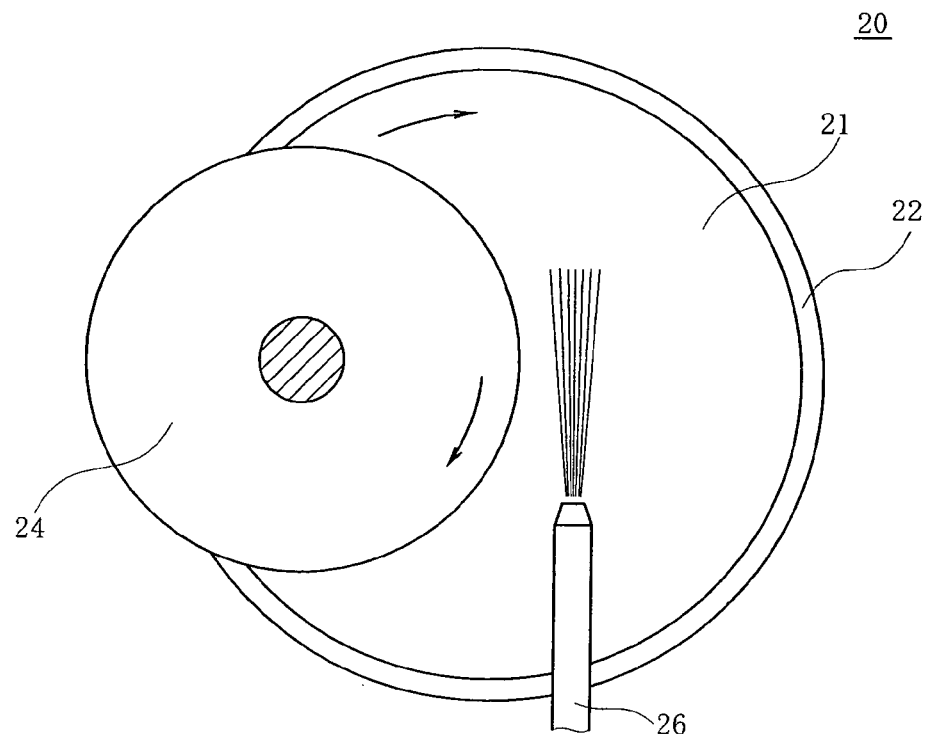
FIG. 2 is a top view showing a grinding device.
Figure 3:
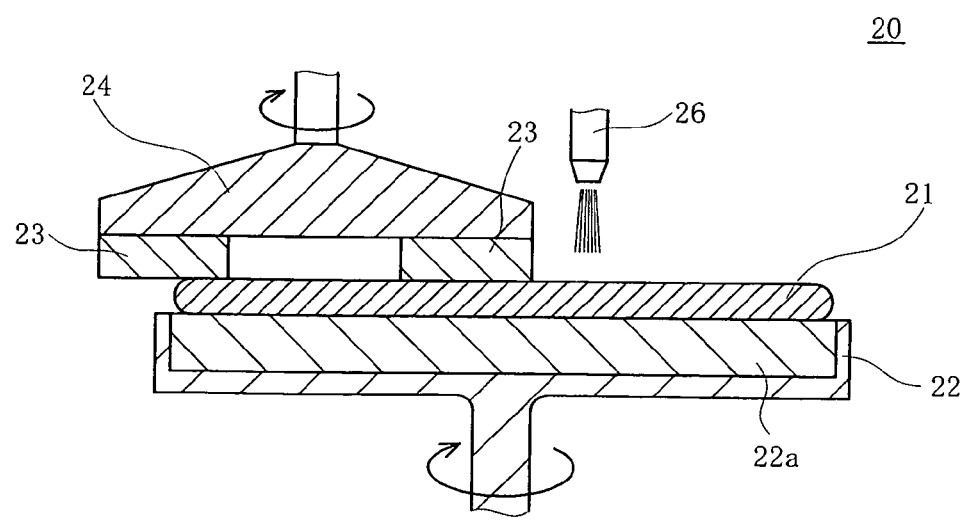
FIG. 3 is a horizontal cross sectional view showing the grinding device.

As a method to planarize a wafer by grinding, the wafer is grinded by use of a grinding device 20 as shown in FIG. 2 and FIG. 3. As shown in FIG. 2, a turn table 22 as a wafer supporting unit for loading a silicon wafer 21 thereon is structured so as to rotate around a vertical axis by a driving mechanism not illustrated therein. Above the turn table 22, as shown in FIG. 3, to the silicon wafer 21 absorbed and loaded on the turn table 22 via a chuck 22a, a grinding stone supporting means 24 for supporting a grinding stone 23 is arranged so as to press the grinding surface thereof. This grinding stone supporting means 24 is structured so as to rotate the grinding stone 23 around the vertical axis by a driving mechanism not illustrated therein. Further, above the silicon wafer, a water supply nozzle 26 for supplying grinding water onto the surface of the silicon wafer at grinding is arranged. In such a grinding device 20, the grinding stone 23 and the silicon wafer 21 are relatively rotated by the respective driving mechanisms, further the grinding water is supplied from the water supply nozzle 26 to the portion out of the contact portion with the grinding stone 23 on the surface of the silicon wafer 21, and the surface of the silicon wafer 21 is cleaned while the grinding stone 23 is pressed onto the surface of the silicon wafer 21 to grind it.

Figure 4:
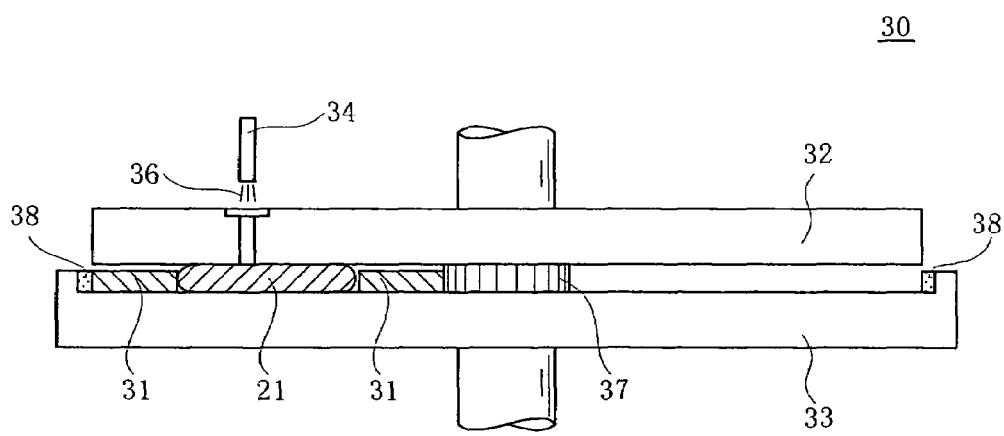
FIG. 4 is a structural view showing a lapping device.

Further, as a method to planarize a wafer by lapping, the wafer is planarized by use of a lapping device 30 as shown in FIG. 4. As shown in FIG. 4, first, a carrier plate 31 is engaged with a sun gear 37 and an internal gear 38 of the lapping device 30, and the silicon wafer 21 is set into a holder of the carrier plate 31. Thereafter, both of the surfaces of this silicon wafer 21 is held so as to be pinched by an upper surface table 32 and a lower surface table 33, and a grinding agent 36 is supplied from a nozzle 34, and the carrier plate 31 is moved in a sun-and-planet motion by the sun gear 37 and the internal gear 38, and at the same time, the upper surface table 32 and the lower surface table 33 are rotated relatively, thereby both of the surfaces of the silicon wafer 21 are lapped simultaneously. In this manner, the silicon wafer after the planarizing process 13, wherein the flatness degree of the upperside and lowerside surfaces of the wafer and the parallel degree of the wafer are increased, is cleaned in the cleaning process and sent to the next process.

Next, referring back to FIG. 1, the planarized silicon wafer is dipped into an etching liquid and the upperside and lowerside surfaces of the silicon wafer are etched (step 14). The etching liquid used herein is the etching liquid for controlling a silicon wafer surface shape according to the present invention. In this etching process 14, the work-affected layer introduced by the mechanical processes such as the chamfering process 12 and the planarizing process is removed completely by etching. By etching using the etching liquid for controlling a silicon wafer surface shape according to the present invention adjusted by adding silica powder, the surface roughness and the texture size of the wafer can be controlled, and accordingly, it is possible to reduce the polishing removal amount in the upperside and lowerside surfaces of the wafer in the both-side simultaneous polishing process 16 and the one-side polishing process following thereto, and further attain both the maintenance of a high flatness degree of the wafer and the reduction of the wafer surface roughness at completion of the planarizing process. It is preferable that the etching removal depth in the etching process 14 is 8 to 10 μm for each surface, and the total removal depth for the upperside and lowerside surfaces of the wafer is 16 to 20 μm. By setting the etching removal depth in the above range, it is possible to greatly reduce the grinding removal amount in the following both-side simultaneous polishing process and the one-side polishing process. If the etching removal depth is below the lower limit value, the wafer surface roughness is not reduced sufficiently, loads in the both-side simultaneous polishing process and the one-side polishing process become large, meanwhile, if the etching removal depth is above the upper limit value, the wafer flatness degree is deteriorated and productivity in the wafer manufacture is decreased.

Figure 5:
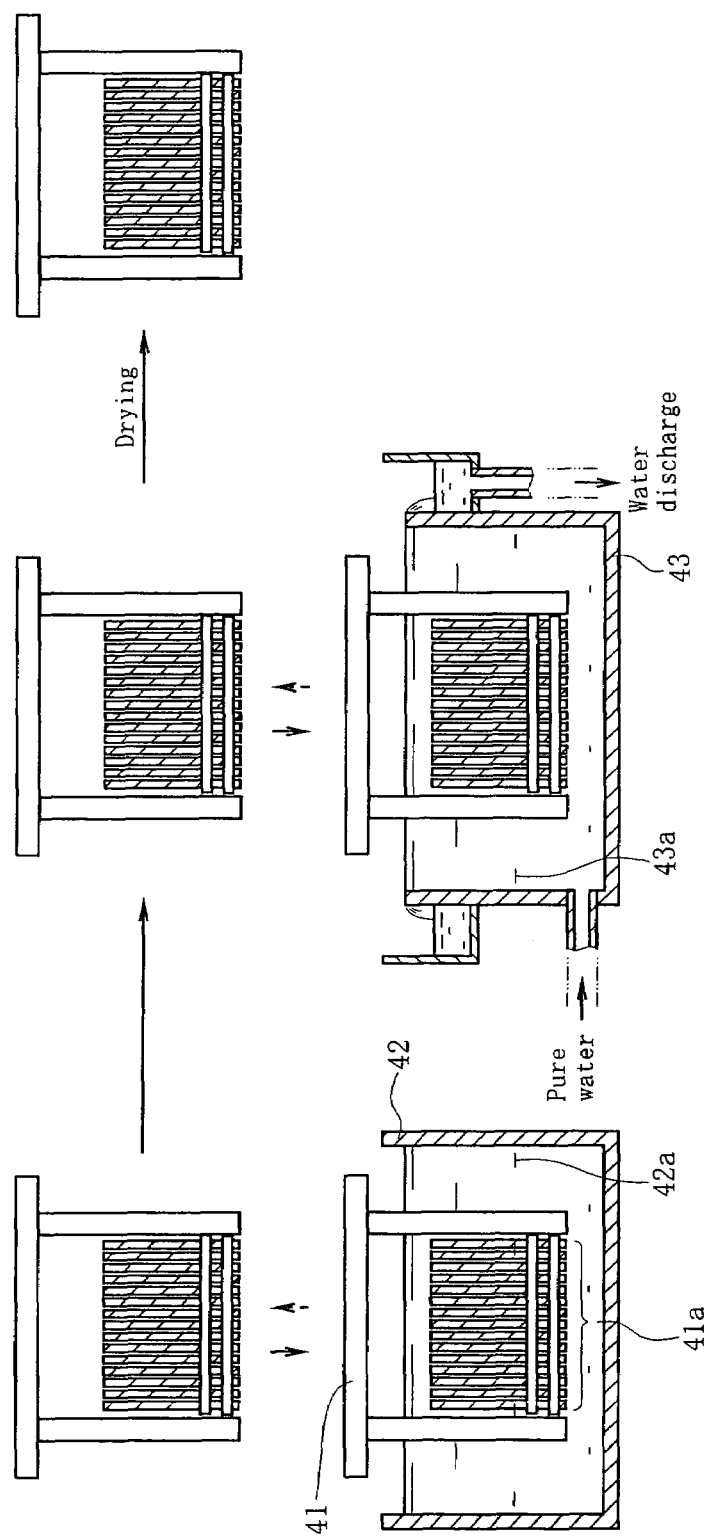
FIG. 5 is a figure showing an etching process.

In this etching process 14, as shown in FIG. 5, first, a plurality of wafers 41a are held vertically in a holder 41, and this holder 41 is lowered as shown by a solid line arrow in FIG. 5, and dipped into the etching liquid 42a for controlling a silicon wafer surface shape according to the present invention stored in an etching bath 42 and the work-affected layer of the wafer surface is removed by the etching liquid. Then, the holder 41 wherein the wafers 41a dipped in the etching liquid 42a for a specified time is pulled up as shown in a dot line arrow in FIG. 5. Next, the holder 41 wherein the wafers 41a after the etching process are held is lowered as shown by the solid line arrow in FIG. 5, and dipped into a rinse liquid 43a such as pure water or the like stored in a rinse bath 43 and the etching liquid attaching to the wafer surface is removed. Thereafter, the holder 41 wherein the wafers 41a dipped in the rinse liquid 43a for a specified time is pulled up as shown by the dot line arrow in FIG. 5, and the silicon wafer is dried.

Next, referring back to FIG. 1, the both-side simultaneous polishing process for polishing the upperside and lowerside surfaces of the wafer after the etching process 14 simultaneously is carried out (step 16).

Figure 6:
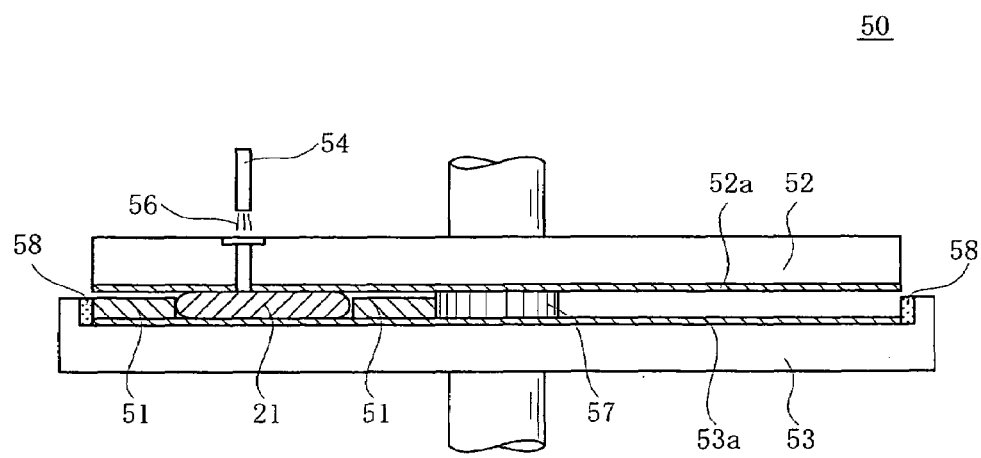
FIG. 6 is a structural view showing a both-side simultaneous grinding device.
Figure 7:
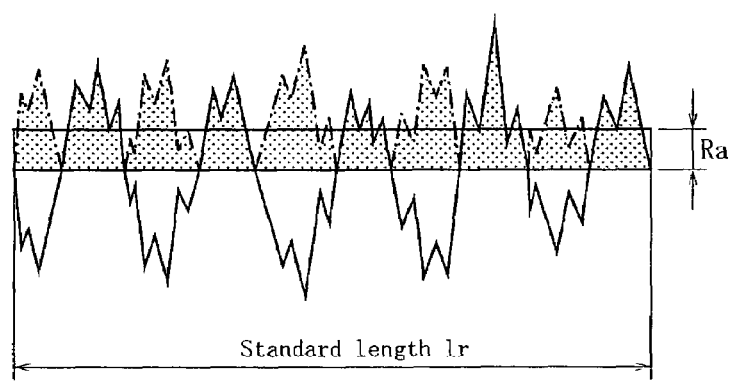
FIG. 7 is a cross sectional view of a wafer for explaining how to obtain Ra.

As a method to polish the upperside and lowerside surfaces simultaneously, polishing is carried out by use of a both-side simultaneous polishing device 50 as shown in FIG. 6. As shown in FIG. 6, first, a carrier plate 51 is engaged with a sun gear 57 and an internal gear 58 of the both-side simultaneous polishing device 50, and the silicon wafer 21 is set into a holder of the carrier plate 51. Thereafter, both of the surfaces of this silicon wafer 21 is held so as to be pinched by an upper surface table 52 to which a first grinding cloth 52a is attached to the polishing surface side thereof and a lower surface table 53 to which a second grinding cloth 53a is attached, and a grinding agent 56 is supplied from a nozzle 54, and the carrier plate 51 is moved in a sun-and-planet motion by the sun gear 57 and the internal gear 58, and at the same time, the upper surface table 52 and the lower surface table 53 are rotated relatively, thereby both of the surfaces of the silicon wafer 21 are mirror-polished simultaneously. Further, in this both-side simultaneous polishing process 16, the rotation speeds of upper surface table 52 and the lower surface table 53 are controlled respectively and the both of the surfaces of the silicon wafer are polished simultaneously, thereby, it is possible to obtain a one-side mirror surface wafer whose upperside and lowerside surfaces can be identified by visual inspection. By performing the method for manufacturing a silicon wafer according to the present invention as mentioned above, productivity in the wafer manufacture can be improved to a great extent.

Meanwhile, in the aspect of the present preferred embodiment, the upperside and lowerside surfaces of the wafer are polished simultaneously, however, it will be known to those skilled in the art that, instead of this both-side simultaneous polishing, by one-side polishing wherein the upperside and lowerside surfaces of the wafer are polished one after another, the same effect can be attained.

EXAMPLE

Examples according to the present invention are explained in more details together with comparative examples hereinafter.

Examples 1 to 4

First, a plurality of φ200 mm silicon wafers were prepared, and as a planarizing process, the upperside and lowerside surfaces of the silicon wafer were lapped by use of a lapping device shown in FIG. 4. As a polishing agent in the lapping process, a polishing agent whose count was #1500 including $Al_2O_3$ was employed, and the flow rate of the polishing agent used was controlled at 2.0 L/min, and the load of the upper surface table was controlled at 70 g/cm$^2$, and the rotation speed of the upper surface table was controlled at 10 rpm, and the rotation speed of the lower surface table was controlled at 40 rpm, and the silicon wafer was planarized. Next, the silicon wafer after being planarized was etched by use of the etching device shown in FIG. 5. As etching liquids, four kinds of etching liquids wherein silica powder whose average particle diameter was 2 to 5 μm was mixed to 51 weight % sodium hydroxide and adjusted to be 1 g/L, 5 g/L, 10 g/L and 100 g/L respectively to the sodium hydroxide were employed. In this etching process, the silicon wafer was dipped in the etching liquid for 15 minutes and etched therein. The etching removal depth in this etching was 10 μm for one side of the wafer, and 20 μm for both the sides of the wafer.

Examples 5 to 8

The planarizing process and the etching process were performed in the same manner as examples 1 to 4 except that the alkali aqueous solution to be used in the etching liquid in the etching process was replaced with 48 weight % sodium hydroxide aqueous solution.

Comparative Examples 1 to 3

The planarizing process and the etching process were performed in the same manner as example 1 except that as alkali aqueous solutions, three kinds of chemical liquids composed of only 51 weight % sodium hydroxide were prepared, and the chemical liquids were used as etching liquids in the etching process as they were. Namely, silica powder was not added to the etching liquids.

Comparative Examples 4 to 6

The planarizing process and the etching process were performed in the same manner as example 1 except that as alkali aqueous solutions, three kinds of chemical liquids composed of only 48 weight % sodium hydroxide were prepared, and the chemical liquids were used as etching liquids in the etching process as they were. Namely, silica powder was not added to the etching liquids.

Examples 9 to 16

The planarizing process and the etching process were performed in the same manner as examples 1 to 8 except that the load of the upper surface table of the lapping device in the lapping process was controlled at 100 g/cm$^2$ and the silicon wafer was planarized.

Comparative Examples 7 to 12

The planarizing process and the etching process were performed in the same manner as comparative examples 1 to 6 except that the load of the upper surface table of the lapping device in the lapping process was controlled at 100 g/cm$^2$ and the silicon wafer was planarized.

Examples 17 to 24

The planarizing process and the etching process were performed in the same manner as examples 1 to 8 except that as a polishing agent in the lapping process, a polishing agent whose count was #1000 including $Al_2O_3$ was employed, and the load of the upper surface table of the lapping device was controlled at 100 g/cm² and the silicon wafer was planarized.

Comparative Examples 13 to 18

The planarizing process and the etching process were performed in the same manner as comparative examples 1 to 6 except that as a polishing agent in the lapping process, a polishing agent whose count was #1000 including $Al_2O_3$ was employed, and the load of the upper surface table of the lapping device was controlled at 100 g/cm² and the silicon wafer was planarized.

Examples 25 to 28

The planarizing process and the etching process were performed in the same manner as Examples 1 to 4 except that the load of the upper surface table of the lapping device in the lapping process was controlled at 100 g/cm² and the silicon wafer was planarized, and the alkali aqueous solution to be used in the etching liquid in the etching process was replaced with 48 weight % sodium hydroxide aqueous solution.

Examples 29 to 32

The planarizing process and the etching process were performed in the same manner as examples 1 to 4 except that as a polishing agent in the lapping process, a polishing agent whose count was #1000 including $Al_2O_3$ was employed, and the load of the upper surface table of the lapping device was controlled at 100 g/cm² and the silicon wafer was planarized, and the alkali aqueous solution to be used in the etching liquid in the etching process was replaced with 48 weight % sodium hydroxide aqueous solution.

Comparative Examples 19 to 21

The planarizing process and the etching process were performed in the same manner as comparative examples 1 to 3 except that as a polishing agent in the lapping process, a polishing agent whose count was #1000 including $Al_2O_3$ was employed, and the alkali aqueous solution to be used in the etching liquid in the etching process was replaced with 48 weight % sodium hydroxide aqueous solution.

Comparative Examples 22 to 24

The planarizing process and the etching process were performed in the same manner as comparative examples 1 to 3 except that as a polishing agent in the lapping process, a polishing agent whose count was #1000 including $Al_2O_3$ was employed, and the load of the upper surface table of the lapping device was controlled at 100 g/cm² and the silicon wafer was planarized, and the alkali aqueous solution to be used in the etching liquid in the etching process was replaced with 48 weight % sodium hydroxide aqueous solution.

Comparison Test 1

To the silicon wafers obtained in examples 1 to 32 and comparative examples 1 to 24, the wafer surface roughness thereof was measured by use of a non contact surface roughness gauge (manufactured by Chapman), and Ra and Rmax as the basic parameters of wafer surface shapes were obtained respectively. The mathematical average roughness Ra as the amplitude average parameter in the height direction is expressed by the average of the absolute values of Z (x) in the standard length, when the standard length is defined as lr, as shown in the following equation (1).

$$Ra = \frac{1}{lr} \int_0^{lr} |Z(x)| dx \quad (1)$$

Figure 8:
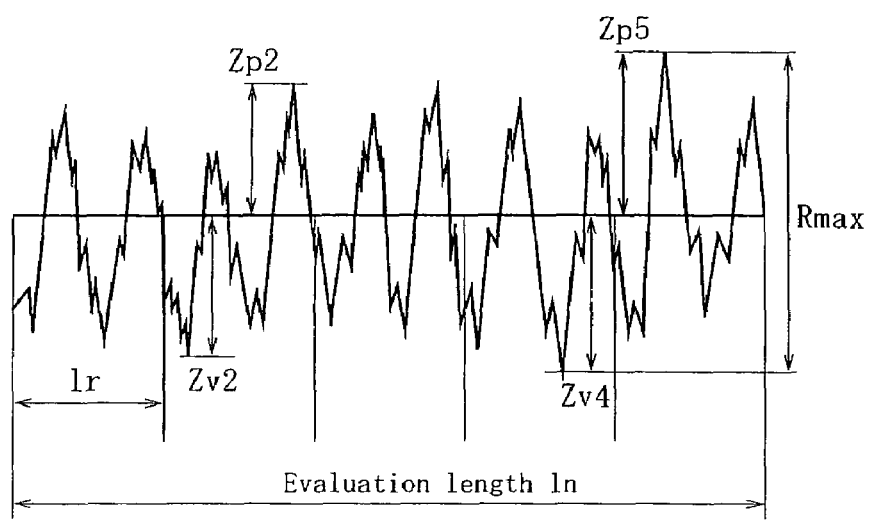
FIG. 8 is a cross sectional view of a wafer for explaining how to obtain Rmax.

Further, the maximum cross sectional height Rmax of a roughness curve as the parameter of the peak and the bottom in the height direction is expressed by the sum of the maximum value of the peak height Zp of a outline curve in the evaluation length ln and the maximum value of the bottom depth Zv, in the wafer surface shown in FIG. 8, as shown in the following equation. In FIG. 8, the maximum value of the peak height Zp is $Zp_6$, and the maximum value of the bottom depth Zv is $Zv_4$.

$$R\max = \max(Zpi) + \max(Zvi) \quad (2)$$

The results of Ra and Rmax in the silicon wafers obtained in examples 1 to 32 and comparative examples 1 to 24 are shown in Table 1 to Table 4 respectively.

TABLE 1

| | Lapping process | | Etching process | | | Wafer surface roughness after etching process | |
|---|---|---|---|---|---|---|---|
| | Count of polishing agent | Load of upper surface table [g/cm²] | Concentration of alkali aqueous solution | Kind of alkali aqueous solution | Addition rate of silica powder | Ra [nm] | Rmax [μm] |
| Example 1 | #1500 | 70 | 51 weight % | NaOH | 1 g/L | 185 | 1.81 |
| Example 2 | | | | | 5 g/L | 183 | 1.75 |
| Example 3 | | | | | 10 g/L | 180 | 1.72 |
| Example 4 | | | | | 100 g/L | 175 | 1.65 |
| Example 5 | | | 48 weight % | NaOH | 1 g/L | 246 | 2.36 |
| Example 6 | | | | | 5 g/L | 243 | 2.28 |
| Example 7 | | | | | 10 g/L | 233 | 2.24 |
| Example 8 | | | | | 100 g/L | 231 | 2.15 |
| Comparative Example 1 | #1500 | 70 | 51 weight % | NaOH | — | 191 | 1.91 |

TABLE 1-continued

| | Lapping process | | Etching process | | | Wafer surface roughness after etching process | |
|---|---|---|---|---|---|---|---|
| | Count of polishing agent | Load of upper surface table [g/cm²] | Concentration of alkali aqueous solution | Kind of alkali aqueous solution | Addition rate of silica powder | Ra [mm] | Rmax [μm] |
| Comparative Example 2 | | | | | — | 197 | 1.93 |
| Comparative Example 3 | | | | | — | 211 | 1.95 |
| Comparative Example 4 | | | 48 weight % | NaOH | — | 258 | 2.51 |
| Comparative Example 5 | | | | | — | 267 | 2.48 |
| Comparative Example 6 | | | | | — | 251 | 2.55 |

TABLE 2

| | Lapping process | | Etching process | | | Wafer surface roughness after etching process | |
|---|---|---|---|---|---|---|---|
| | Count of polishing agent | Load of upper surface table [g/cm²] | Concentration of alkali aqueous solution | Kind of alkali aqueous solution | Addition rate of silica powder | Ra [mm] | Rmax [?m] |
| Example 9 | #1500 | 100 | 51 weight % | NaOH | 1 g/L | 236 | 2.15 |
| Example 10 | | | | | 5 g/L | 233 | 2.08 |
| Example 11 | | | | | 10 g/L | 229 | 2.05 |
| Example 12 | | | | | 100 g/L | 223 | 1.96 |
| Example 13 | | | 48 weight % | NaOH | 1 g/L | 310 | 2.65 |
| Example 14 | | | | | 5 g/L | 306 | 2.56 |
| Example 15 | | | | | 10 g/L | 294 | 2.52 |
| Example 16 | | | | | 100 g/L | 291 | 2.41 |
| Comparative Example 7 | #1500 | 100 | 51 weight % | NaOH | — | 250 | 2.30 |
| Comparative Example 8 | | | | | — | 255 | 2.25 |
| Comparative Example 9 | | | | | — | 258 | 2.34 |
| Comparative Example 10 | | | 48 weight % | NaOH | — | 320 | 2.80 |
| Comparative Example 11 | | | | | — | 328 | 2.75 |
| Comparative Example 12 | | | | | — | 330 | 2.92 |

TABLE 3

| | Lapping process | | Etching process | | | Wafer surface roughness after etching process | |
|---|---|---|---|---|---|---|---|
| | Count of polishing agent | Load of upper surface table [g/cm²] | Concentration of alkali aqueous solution | Kind of alkali aqueous solution | Addition rate of silica powder | Ra [mm] | Rmax [μm] |
| Example 17 | #1000 | 100 | 51 weight % | NaOH | 1 g/L | 332 | 3.33 |
| Example 18 | | | | | 5 g/L | 328 | 3.22 |
| Example 19 | | | | | 10 g/L | 323 | 3.16 |
| Example 20 | | | | | 100 g/L | 314 | 3.03 |
| Example 21 | | | 48 weight % | NaOH | 1 g/L | 395 | 3.55 |
| Example 22 | | | | | 5 g/L | 390 | 3.44 |
| Example 23 | | | | | 10 g/L | 374 | 3.38 |
| Example 24 | | | | | 100 g/L | 371 | 3.24 |

TABLE 3-continued

| | | Lapping process | Etching process | | | Wafer surface roughness after etching process | |
|---|---|---|---|---|---|---|---|
| | Count of polishing agent | Load of upper surface table [g/cm²] | Concentration of alkali aqueous solution | Kind of alkali aqueous solution | Addition rate of silica powder | Ra [mm] | Rmax [μm] |
| Comparative Example 13 | #1000 | 100 | 51 weight % | NaOH | — | 355 | 3.52 |
| Comparative Example 14 | | | | | — | 361 | 3.54 |
| Comparative Example 15 | | | | | — | 359 | 3.58 |
| Comparative Example 16 | | | 48 weight % | NaOH | — | 410 | 3.74 |
| Comparative Example 17 | | | | | — | 415 | 3.76 |
| Comparative Example 18 | | | | | — | 420 | 3.87 |

TABLE 4

| | | Lapping process | Etching process | | | Wafer surface roughness after etching process | |
|---|---|---|---|---|---|---|---|
| | Count of polishing agent | Load of upper surface table [g/cm²] | Concentration of alkali aqueous solution | Kind of alkali aqueous solution | Addition rate of silica powder | Ra [mm] | Rmax [μm] |
| Example 25 | #1500 | 100 | 48 weight % | KOH | 1 g/L | 327 | 3.45 |
| Example 26 | | | | | 5 g/L | 324 | 3.34 |
| Example 27 | | | | | 10 g/L | 319 | 3.28 |
| Example 28 | | | | | 100 g/L | 310 | 3.15 |
| Example 29 | #1000 | 100 | 48 weight % | KOH | 1 g/L | 483 | 5.02 |
| Example 30 | | | | | 5 g/L | 478 | 4.85 |
| Example 31 | | | | | 10 g/L | 470 | 4.77 |
| Example 32 | | | | | 100 g/L | 475 | 4.57 |
| Comparative Example 19 | #1500 | 100 | 48 weight % | KOH | — | 351 | 3.67 |
| Comparative Example 20 | | | | | — | 355 | 3.68 |
| Comparative Example 21 | | | | | — | 354 | 3.70 |
| Comparative Example 22 | #1000 | 100 | 48 weight % | KOH | — | 510 | 5.35 |
| Comparative Example 23 | | | | | — | 523 | 5.25 |
| Comparative Example 24 | | | | | — | 530 | 5.45 |

As is clear from Tables 1 to 4, in the comparison of examples 1 to 32 wherein the silica powder was added to the alkali aqueous solution, and comparative examples 1 to 24 wherein the silica powder was not added to the alkali aqueous solution, among the wafers that were planarized under the same conditions, it is known that the results of Ra and Rmax decrease in examples 1 to 32. From this result, a result has been obtained that, by using the etching liquid wherein the silica powder is added to the alkali aqueous solution, the wafer surface roughness and the wafer flatness degree are improved respectively, and it is possible to greatly reduce the grinding removal amount in the both-side simultaneous polishing process following thereto. Furthermore, in the comparison of the results of examples 1 to 32, a tendency that as the addition amount of the silica powder to be added to the alkali aqueous solution is higher, so the results of Ra and Rmax decrease respectively has been obtained.

Examples 33 to 35

First, a plurality of φ200 mm silicon wafers were prepared, and as a planarizing process, the upperside and lowerside surfaces of the silicon wafer were lapped in the same manner as example 1. Next, to the wafer after lapping, by use of the grinding device shown in FIG. 2 and FIG. 3, final grinding was carried out on the silicon wafer surface. As the grinding conditions, the grinding count of the grinding stone was set #2000, the diamond distribution central particle diameter was 3 to 4 μm, the rotation speed of the spindle (wheel) was 4800 rpm, the feed speed was 0.3

μm/sec, the rotation speed of the wafer (wafer chuck) was 20 rpm, and the processing removal amount was set 10 μm or below. Next, as an etching process, as an etching process, the silicon wafer after being planarized was etched by use of the etching device shown in FIG. 5. As etching liquids, three kinds of etching liquids wherein silica powder whose average particle diameter was 2 to 5 μm was mixed to 48 weight % sodium hydroxide and adjusted to be 1 g/L, 10 g/L and 100 g/L respectively to the sodium hydroxide were employed. In this etching process, the silicon wafer was dipped in the etching liquid for 15 minutes and etched therein. The etching removal depth in this etching was 2.5 μm for one side of the wafer, and 5 μm for both the sides of the wafer.

Comparative Examples 25 to 27

The planarizing process and the etching process were performed in the same manner as examples 33 to 35 except that as alkali aqueous solutions, three kinds of chemical liquids composed of only 48 weight % sodium hydroxide were prepared, and the chemical liquids were used as etching liquids in the etching process as they were. Namely, silica powder was not added to the etching liquids.

Comparison Test 2

To the silicon wafers obtained in examples 33 to 35 and comparative examples 25 to 27, the wafer surface roughness thereof was measured by use of a non contact surface roughness gauge (manufactured by Chapman), and Ra and Rmax as the basic parameters of wafer surface shapes were obtained respectively. The results of Ra and Rmax in the silicon wafers obtained in examples 33 to 35 and comparative examples 25 to 27 are shown in Table 5 respectively.

under the same conditions, it is known that the results of Ra and Rmax decrease in examples 33 to 35. From this result, a result has been obtained that, by using the etching liquid wherein the silica powder is added to the alkali aqueous solution, the wafer surface roughness and the wafer flatness degree are improved respectively, and it is possible to greatly reduce the grinding removal amount in the both-side simultaneous polishing process following thereto. Furthermore, a tendency that as the addition amount of the silica powder to be added to the alkali aqueous solution is higher, so the results of Ra and Rmax decrease respectively has been obtained.

What is claimed is:

1. A method for manufacturing a silicon wafer comprising:
    a planarizing process for polishing or lapping the upperside and lowerside surfaces of a thin disk-shaped silicon wafer obtained by slicing a silicon single crystal ingot;
    an etching process for dipping the silicon wafer into an etching liquid having silica powder dispersed uniformly in an alkali aqueous solution to thereby etch the upperside and lowerside surfaces of the silicon wafer; and
    a both-side simultaneous polishing process for polishing the upperside and lowerside surfaces of the etched silicon wafer simultaneously, in this order.

2. A method for manufacturing a silicon wafer comprising:
    a planarizing process for polishing or lapping the upperside and lowerside surfaces of a thin disk-shaped silicon wafer obtained by slicing a silicon single crystal ingot;

TABLE 5

| | Lapping process | | | Etching process | | | Wafer surface roughness after etching process | |
|---|---|---|---|---|---|---|---|---|
| | Count of polishing agent | Load of upper surface table [g/cm$^2$] | Finish grinding process | Concentration of alkali aqueous solution | Kind of alkali aqueous solution | Addition rate of silica powder | Ra [mm] | Rmax [μm] |
| Example 33 | #1000 | 100 | Count of grinding: #2000 Diamond distribution central particle diameter: 3 to 4 μm | 48 weight % | NaOH | 1 g/L | 30.0 | 0.25 |
| Example 34 | | | | | | 10 g/L | 20.0 | 0.20 |
| Example 35 | | | | | | 100 g/L | 16.0 | 0.15 |
| Comparative Example 25 | #1000 | 100 | Count of grinding: #2000 Diamond distribution central particle diameter: 3 to 4 μm | 48 weight % | NaOH | — | 31.0 | 0.27 |
| Comparative Example 26 | | | | | | — | 31.5 | 0.28 |
| Comparative Example 27 | | | | | | — | 32.2 | 0.28 |

As is clear from Table 5, in the comparison of examples 33 to 35 wherein the silica powder was added to the alkali aqueous solution, and comparative examples 25 to 27 wherein the silica powder was not added to the alkali aqueous solution, among the wafers that were planarized an etching process for dipping the silicon wafer into an etching liquid having silica powder dispersed uniformly in an alkali aqueous solution to thereby etch the upperside and lowerside surfaces of the silicon wafer; and a one-side polishing process for polishing the upperside and lowerside surfaces of the etched silicon wafer one after another, in this order.

3. A method for manufacturing a silicon wafer comprising:
   a planarizing process for polishing or lapping the upperside and lowerside surfaces of a thin disk-shaped silicon wafer obtained by slicing a silicon single crystal ingot;
   an etching process for dipping the silicon wafer into an etching liquid having silica powder dispersed uniformly in an alkali aqueous solution wherein the alkali aqueous solution retains from 40 to 50 weight percent sodium hydroxide and the amount of silica powder is from 1 to 100 g/l to thereby etch the upperside and lowerside surfaces of the silicon wafer; and
   a both-side simultaneous polishing process for polishing the upperside and lowerside surfaces of the etched silicon wafer simultaneously, in this order.

4. A method for manufacturing a silicon wafer comprising:
   a planarizing process for polishing or lapping the upperside and lowerside surfaces of a thin disk-shaped silicon wafer obtained by slicing a silicon single crystal ingot;
   an etching process for dipping the silicon wafer into an etching liquid having silica powder dispersed uniformly in an alkali aqueous solution wherein the average particle diameter of the silica powder is from 50 to 5000 nm to thereby etch the upperside and lowerside surfaces of the silicon wafer; and
   a both-side simultaneous polishing process for polishing the upperside and lowerside surfaces of the etched silicon wafer simultaneously, in this order.

5. A method for manufacturing a silicon wafer comprising:
   a planarizing process for polishing or lapping the upperside and lowerside surfaces of a thin disk-shaped silicon wafer obtained by slicing a silicon single crystal ingot;
   an etching process for dipping the silicon wafer into an etching liquid having silica powder dispersed uniformly in an alkali aqueous solution wherein the average particle diameter of the silica powder is from 500 nm (0.5µ) to 3000 nm (3µ) to thereby etch the upperside and lowerside surfaces of the silicon wafer; and
   a both-side simultaneous polishing process for polishing the upperside and lowerside surfaces of the etched silicon wafer simultaneously, in this order.

6. A method for manufacturing a silicon wafer comprising:
   a planarizing process for polishing or lapping the upperside and lowerside surfaces of a thin disk-shaped silicon wafer obtained by slicing a silicon single crystal ingot;
   an etching process for dipping the silicon wafer into an etching liquid having silica
   powder dispersed uniformly in an alkali aqueous solution wherein the alkali aqueous solution retains from 40 to 50 weight percent sodium hydroxide and the amount of silica powder is from 1 to 100 g/l to thereby etch the upperside and lowerside surfaces of the silicon wafer; and
   a one-side polishing process for polishing the upperside and lowerside surfaces of the etched silicon wafer one after another, in this order.

7. A method for manufacturing a silicon wafer comprising:
   a planarizing process for polishing or lapping the upperside and lowerside surfaces of a thin disk-shaped silicon wafer obtained by slicing a silicon single crystal ingot;
   an etching process for dipping the silicon wafer into an etching liquid having silica powder dispersed uniformly in an alkali aqueous solution wherein the average particle diameter of the silica powder is from 50 to 5000 nm to thereby etch the upperside and lowerside surfaces of the silicon wafer; and
   a one-side polishing process for polishing the upperside and lowerside surfaces of the etched silicon wafer one after another, in this order.

8. A method for manufacturing a silicon wafer comprising:
   a planarizing process for polishing or lapping the upperside and lowerside surfaces of a thin disk-shaped silicon wafer obtained by slicing a silicon single crystal ingot;
   an etching process for dipping the silicon wafer into an etching liquid having silica powder dispersed uniformly in an alkali aqueous solution wherein the average particle diameter of the silica powder is from 500 nm (0.5µ) to 3000 nm (3µ) to thereby etch the upperside and lowerside surfaces of the silicon wafer; and
   a one-side polishing process for polishing the upperside and lowerside surfaces of the etched silicon wafer one after another, in this order.

* * * * *

UNITED STATES PATENT AND TRADEMARK OFFICE
CERTIFICATE OF CORRECTION

PATENT NO. : 7,288,207 B2  Page 1 of 1
APPLICATION NO. : 11/345009
DATED : October 30, 2007
INVENTOR(S) : Sakae Koyata et al.

It is certified that error appears in the above-identified patent and that said Letters Patent is hereby corrected as shown below:

On the cover page, item [54]: now reads, "Title: Etching Liquid for Controlling Silicon Wafer Surface Shape and Method for Manufacturing Silicon Wafer Using the Same"

and should read, -- Title: Method for Manufacturing Silicon Wafer --.

Signed and Sealed this

Third Day of June, 2008

JON W. DUDAS
*Director of the United States Patent and Trademark Office*

UNITED STATES PATENT AND TRADEMARK OFFICE
CERTIFICATE OF CORRECTION

PATENT NO. : 7,288,207 B2  Page 1 of 1
APPLICATION NO. : 11/345009
DATED : October 30, 2007
INVENTOR(S) : Sakae Koyata et al.

It is certified that error appears in the above-identified patent and that said Letters Patent is hereby corrected as shown below:

On the cover page, item [54] and Column 1, lines 1-4: now reads, "Title: Etching Liquid for Controlling Silicon Wafer Surface Shape and Method for Manufacturing Silicon Wafer Using the Same"

and should read, -- Title: Method for Manufacturing Silicon Wafer --.

This certificate supersedes the Certificate of Correction issued June 3, 2008.

Signed and Sealed this

First Day of July, 2008

JON W. DUDAS
*Director of the United States Patent and Trademark Office*